US008503179B2

(12) United States Patent  
Tan et al.

(10) Patent No.: US 8,503,179 B2  
(45) Date of Patent: Aug. 6, 2013

(54) COOLING SYSTEM

(75) Inventors: Li-Kuang Tan, Taoyuan Hsien (TW); Yu-Hung Huang, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 204 days.

(21) Appl. No.: 13/013,826

(22) Filed: Jan. 26, 2011

(65) Prior Publication Data

US 2011/0182028 A1  Jul. 28, 2011

(30) Foreign Application Priority Data

Jan. 28, 2010  (TW) ................................ 99102398 A (51) Int. Cl.  
*H05K 7/20* (2006.01)

(52) U.S. Cl.  
USPC ........ 361/696; 361/679.5; 361/691; 361/701; 454/184; 62/259.2; 312/223.1

(58) Field of Classification Search  
USPC ....... 361/676–678, 679.46–679.51, 688–697, 361/701–703  
See application file for complete search history.

(56) References Cited

FOREIGN PATENT DOCUMENTS

| TW | 1238690 | 8/2005 |
|---|---|---|
| TW | I240607 | 9/2005 |
| TW | I287700 B | 10/2007 |
| TW | 1305710 | 1/2009 |

*Primary Examiner* — Courtney Smith  
(74) *Attorney, Agent, or Firm* — CKC & Partners Co., Ltd.

(57) ABSTRACT

A cooling system including several air jet elements, a heat exchange assembly and a frame is provided. The cooling system is applied to a rack server configured to receive a plurality of electronic assemblies. The air jet elements receive a high-pressure air and convert the high-pressure air into a low-temperature air. The heat exchange assembly is disposed in the frame and is connected to the air jet elements so as to perform a heat exchange between the low-temperature air and a high-temperature air generated by the rack server so as to lower the temperature of the high-temperature air. The frame is applied to accommodate the heat exchange assembly.

19 Claims, 10 Drawing Sheets

COOLING SYSTEM

RELATED APPLICATIONS

This application claims priority to Taiwan Application Serial Number 099102398, filed Jan. 28, 2010, which is herein incorporated by reference.

BACKGROUND

1. Technical Field

The present invention relates to a cooling system. More particularly, the present invention relates to a cooling system applicable to a rack server.

2. Description of Related Art

Modern technology changes with each passing day and advances rapidly. The processing speed of the computers is getting faster and faster, yet the cost of the computers is getting lower and lower. Therefore, the computers are widely used in our daily life nowadays, such as the commercial servers used in business entities and the desktop computers used by individuals. In the case of commercial servers, they are independent operable, swappable computer systems. In one common arrangement, several hard drives are inserted into one enclosure, and several electronic assemblies are integrated in a single rack of a server, therefore constituting a rack server.

Because the rack server includes several electronic assemblies, and the electronic assemblies individually include numerous thermal components like hard drives, central processors, memories . . . etc, massive amount of heat is aggregated within the rack server. The aggregation of heat affects the operation stability of the system and jeopardizes the service quality of the whole system. Due to the above-mentioned drawbacks, it is then an important topic on how to dissipate heat affectivity for the rack server.

In a common computer room accommodating several servers, the temperature within the room is controlled by the air conditioner. Taking the rack server as an example, it uses inbuilt fans of the enclosure to draw the air tempered by the air conditioner into the enclosure, so as to take the heat away from the thermal components. The hot air acquired the heat from the thermal components is rejected back to the room afterwards. By discharging the hot air directly back to the room, the temperature of the computer room is raised, and the heat dissipation rate of the enclosure is lowered. On the other hand, the air conditioner has to use more power to retain the temperature at a stationary level. This completely proceeds backwardly to the trend of saving energy and reducing carbon.

In order to lower the burden of the air conditioner, the industry develops a cooling system that individually lowers the temperature of each rack server. The cooling system takes advantage of the phase changes of a refrigerant to take the heat away from the rack server, so as to lower the temperature. However, this technique requires another heat exchange process to take the heat away from the refrigerant, such as using cooling water to cool off the refrigerant. Once again, yet another heat exchange process that takes the heat away from the cooling water is required. Consequently, the power consumption still can not be reduced. What's more, the problem of refrigerant pollution is further arisen.

SUMMARY

According to one aspect of the invention, a cooling system including several air jet elements, a heat exchange assembly and a frame is provided. The cooling system is applied to a rack server configured to receive a plurality of electronic assemblies. The air jet elements receive a high-pressure air and convert the high-pressure air into a low-temperature air. The heat exchange assembly is disposed in the frame and is connected to the air jet elements so as to perform a heat exchange between the low-temperature air and a high-temperature air generated by the rack server so as to lower the temperature of the high-temperature air. The frame is applied to accommodate the heat exchange assembly.

In one embodiment of the invention, the heat exchange assembly includes several tubes and a fin set. The tubes individually have one end connected to each air jet element so that the low-temperature air passes through the tubes. The tubes penetrate through the fin set to increase the area of heat exchange.

The air jet elements are disposed beneath the heat exchange assembly and the tubes extend vertically and upwardly from the bottom the frame.

The fin set includes several heat-dissipating fins. An air passage is disposed between the two adjacent heat-dissipating fins for allowing the high-temperature air to pass therethrough. The passing direction of the high-temperature air or the extending direction of the heat-dissipating fins is perpendicular to the extending direction of the tubes.

The heat exchange assembly includes at least a vertical fin set and at least a horizontal fin set. The vertical fin set has a plurality of vertical heat-dissipating fins, wherein at least a vertical air passage is disposed between the two adjacent vertical heat-dissipating fins for allowing the low-temperature air to pass therethrough. The horizontal fin set is disposed adjacent to the vertical fin set and has a plurality of horizontal heat-dissipating fins, wherein at least a horizontal air passage is disposed between the two adjacent horizontal heat-dissipating fins for allowing the high-temperature air to pass therethrough.

The low-temperature air is transformed into a warm air after passing through the heat exchange assembly, and the cooling system further includes a first fan assembly and a second fan assembly. The first fan assembly is disposed on the upper end of the frame and situated above the heat exchange assembly to discharge the warm air to the outside of the cooling system. The second fan assembly is disposed on one lateral side of the frame and is adjacent to the heat exchange assembly to drive the high-temperature air passing through the heat exchange assembly.

The frame and the heat exchange assembly are disposed at the lateral or rear side of the rack server. The heat exchange assembly is made of copper, aluminum or a thermally conductive material.

The cooling system further includes a compressor for supplying the high-pressure air.

The air jet elements are air jet nozzles or vortex tubes.

According to another aspect of the invention, a cooling system including several air jet elements and an air reservoir is provided. The cooling system is applicable to a rack server having a plurality of electronic assemblies inserted therein. The air jet elements receive a high-pressure air and convert the high-pressure air into a low-temperature air. The air reservoir disposed between each of the electronic assemblies and the air jet elements. One side of the reservoir receives the low-temperature air and the other side of the reservoir discharges the low-temperature air to dissipate heat of the electronic assemblies. The low-temperature air enters the air reservoir and subsequently enters the electronic assemblies to dissipate heat.

In one embodiment of the invention, each of the electronic assemblies, corresponding air jet elements and the air reservoir are disposed alongside in a same plane. The cooling system further includes a fan assembly for, driving the low-temperature air in the air reservoir to move into the electronic assemblies. The air jet elements are disposed in an array arrangement and individually include an air inlet and an air outlet. The high-pressure air enters each air jet element through the air inlet and the low-temperature air leaves each air jet element through the air outlet. The cooling system further includes at least one air pipe connected to each air inlet to supply the high-pressure air into the air jet elements.

According to a further aspect of the invention, a cooling system including several first air jet elements, a heat exchange assembly, a frame, several second air jet elements and several air reservoirs is provided. The cooling system is applicable to a rack server having several electronic assemblies inserted therein. The first air jet elements receive a high-temperature air and convert it into a first low-temperature air. The second air jet elements convert the high-pressure air into a second low-temperature air. The heat exchange assembly facilitates a heat exchange between the first low-temperature air and a high-temperature air discharged by the rack server. One side of the reservoir receives the second low-temperature air and the other side of the reservoir discharge the second low-temperature air to dissipate heat of the electronic assemblies. The second low-temperature air enters the air reservoirs and subsequently enters each of the electronic assemblies to dissipate heat.

In the foregoing cooling system, the air jet elements are used to convert the high-pressure air into the low-temperature air, and the heat exchange and the heat dissipation can be performed thereafter without any refrigerants. The cooling system at least has the merits of cheap, energy saving and environmentally friendly.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Figure 1:
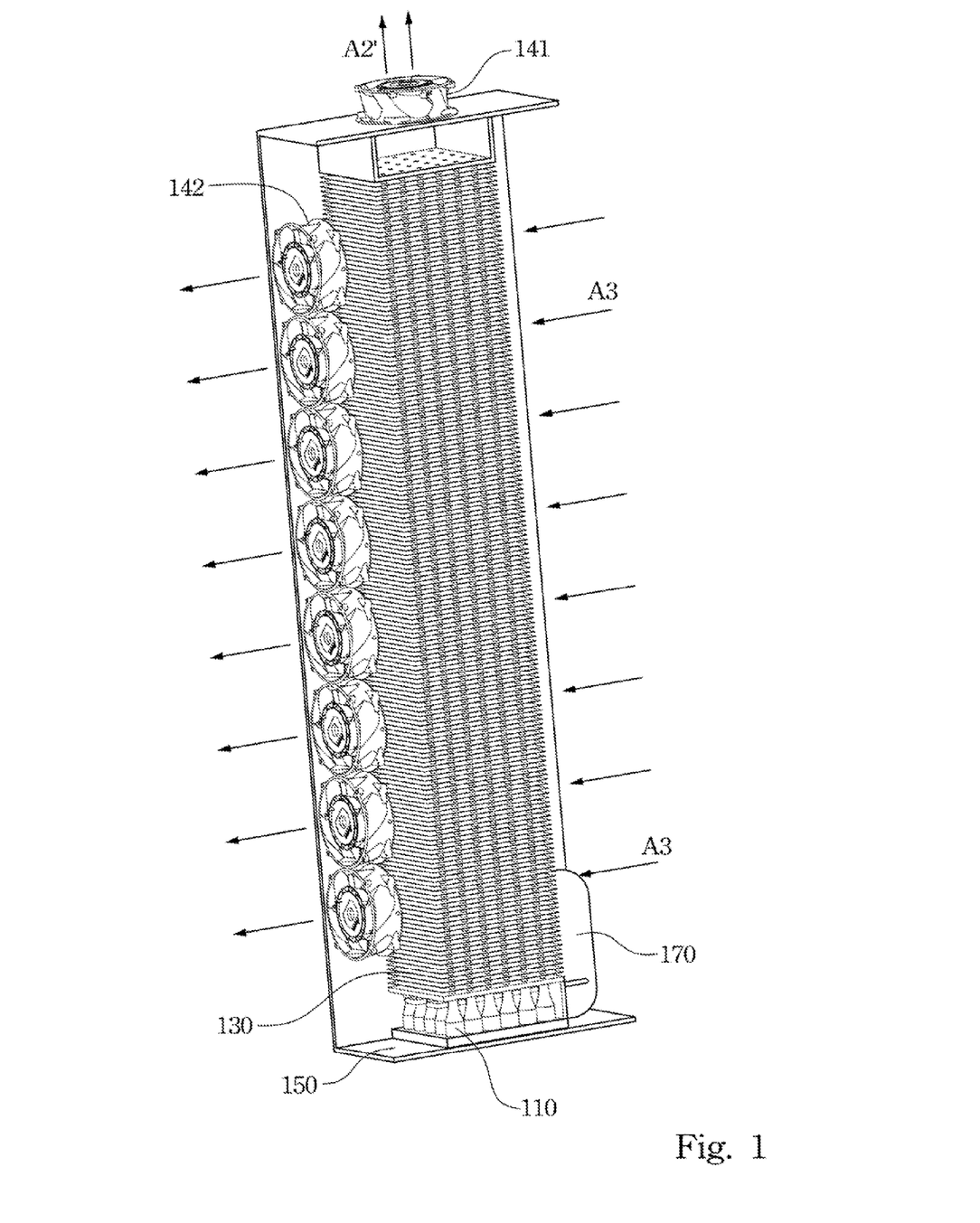
FIG. 1 is a three-dimensional diagram of a cooling system according to one embodiment of the invention.
Figure 2:
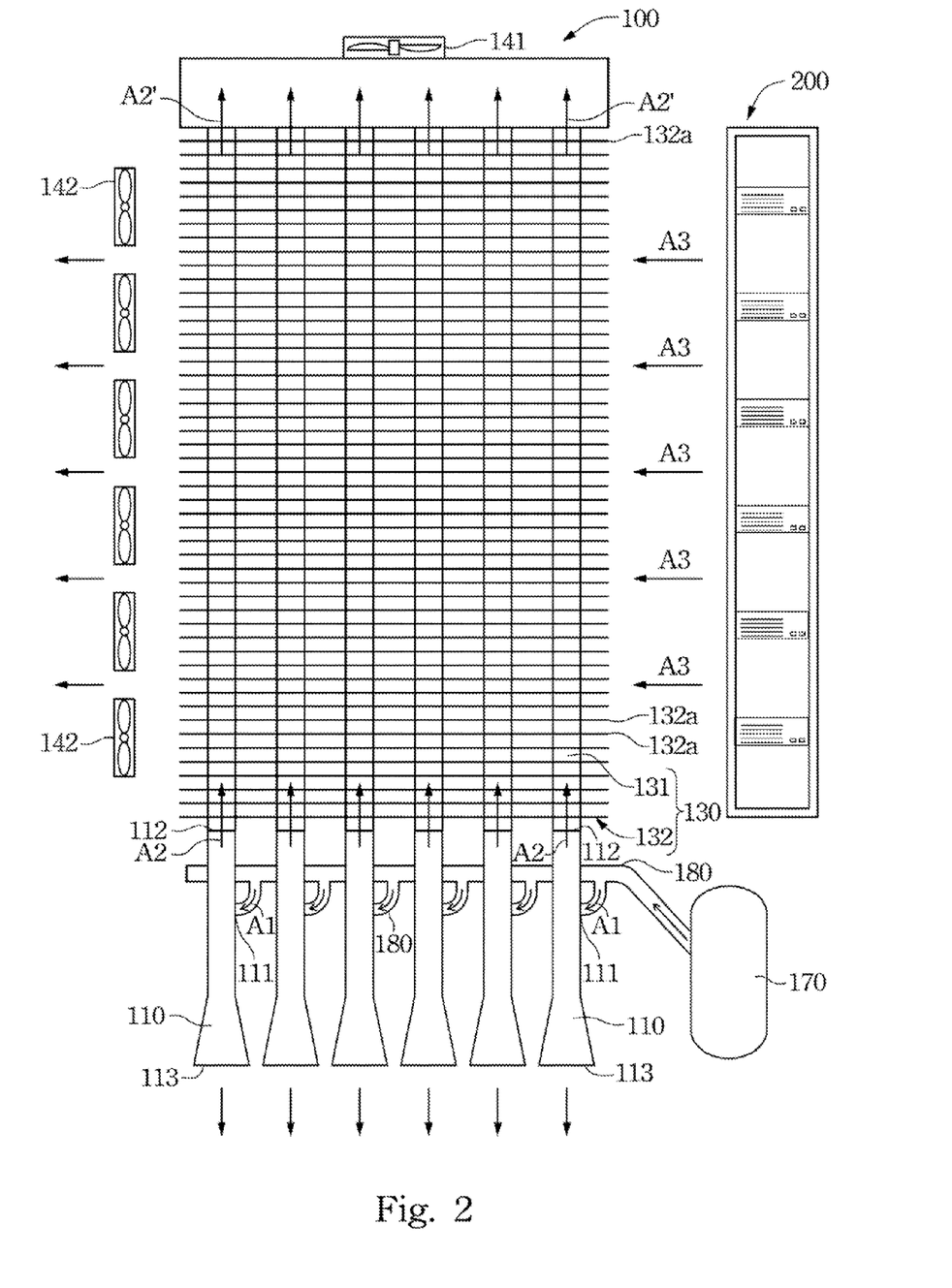
FIG. 2 is a perspective view of the heat exchange assembly and the air jet elements of the cooling system.

Please refer to FIG. 1 and FIG. 2 at the same time. FIG. 1 is a three-dimensional diagram of a cooling system according to one embodiment of the invention. FIG. 2 is a perspective view of the heat exchange assembly and the air jet elements of the cooling system. The cooling system 100 is applicable to a rack server 200. The cooling system 100 includes several air jet elements 110, a heat exchange assembly 130 and a frame 150. The frame 150 is at least used for disposing the heat exchange assembly 130. The air jet elements 110 and the rack server 200 are individually optionally disposed inside or outside the frame 150. In the present embodiment, the air jet elements 110 are disposed inside the frame 150, and the rack server 200 is disposed outside the frame 150 and is disposed alongside the frame 150. In other words, the frame 150 and the heat exchange assembly 130 are disposed at one lateral side of the rack server 200. A high-temperature air A3 discharged by the rack server 200 is guided to the cooling system 100 via a guiding element (not shown in FIG. 1 and FIG. 2), and then flows through the heat exchange assembly 130.

The air jet elements 110 are several jet nozzles, several vortex tubes or other components that lower the temperature by changing the speed of the jet air. The air jet elements 110 receive a high-pressure air A1, and convert the high-pressure air A1 into a low-temperature air A2. Each air jet element 110 includes an air inlet 111 and an air outlet 112. The air inlet 111 accepts the high-pressure air A1, through which the high-pressure air A1 enters the air jet element 110. The air outlet 112 rejects the low-temperature air A2, through which the low-temperature air A2 leaves the air jet element 110. The air jet elements 110 are disposed in an array arrangement, and reject the low-temperature air A2 toward the same direction. Therefore the pipeline arrangement is simplified. In the present embodiment, the air jet elements 110 are exemplified by arranging in a rectangular array. However, the arrangement and the number of the air jet elements 110 are adjustable in accordance with practical product needs.

Exemplarily, the air jet elements 110 are vortex tubes in the present embodiment. After a high-pressure air is received by a vortex tube, a vortex flow is generated by the high-speed spinning in a vortex generating chamber. Part of the air flow is forced to spin inwardly to pass the center of the tube, and flows to an air valve in the tube. The air valve reverses the part of the air flow, and consequently releases the heat to the other part of the air flow outside the air valve. The heat-released, chilled air is then guided to the air outlet to be discharged. The air jet element 110 (the vortex tube) further includes a hot air outlet 113 for discharging hot air. Practically, the temperature of the hot air is higher than that of the high-pressure air A1 and the low-temperature air A2. The temperature of the high-pressure air A1 entering from the air inlet 111 is higher than the temperature of the low-temperature air A2 leaving from the air outlet 112. The hot air discharged from the hot air outlet 113 can be recycled, for example, to heat a swimming pool or to generate power.

One end of the heat exchange assembly 130 is connected to each air outlet 112 of the air jet element 110 to conduct a heat exchange between the low-temperature air A2 and the high-temperature air A3 discharged by the rack server 200, so as to lower the temperature of the high-temperature air A3. Consequently, the discharged temperature of the rack server 200 is lowered, the loading of the air conditioner is therefore alleviated, and the total power consumption is reduced. On the other hand, the chilled air can be recirculated into the rack server 200 to repeat the heat dissipation.

The heat exchange assembly 130 includes several tubes 131 and a fin set 132. The tubes 131 are disposed side-by-side and are generally parallel with each other. One end of each tube 131 is connected to each air outlet 112, so that the low-temperature air A2 can pass through the tubes 131. The tubes 131 penetrate through the fin set 132 to increase the area of heat exchange between the low-temperature air A2 and the high-temperature air A3, and the heat exchange efficiency is increased accordingly. In the present embodiment, the fin set 132 includes several parallel disposed heat-dissipating fins 132a. Each two neighboring heat-dissipating fins 132a define an air passage, and the high-temperature air A3 passes through the air passages. The extending direction of the heat-dissipating fins 132a is perpendicular to the extending direction of the tubes 131. The heat exchange assembly 130 is made of metal, such as copper or aluminum. The material of the heat exchange assembly 130, however, is not limited to metal. Other thermally conductive materials with high thermal conductivity are also eligible for using herein.

More specifically, in the present embodiment, the air jet elements 110 are disposed beneath the heat exchange assembly 130. The tubes 131 extend vertically and upwardly from the bottom the frame 150. Correspondingly, when the low-temperature air A2 leaves the air outlets 112 of the air jet elements 110, it moves vertically toward the top end of the frame 150. Due to the reason that the extending direction of the heat-dissipating fins 132a is perpendicular to that of the tubes 131, the high-temperature air A3 passes through the fin set 132 horizontally; that is, the moving direction of the high-temperature air A3 is perpendicular to the extending direction of the tubes 131. In the heat exchange assembly 130 of the present embodiment, the low-temperature air A2 and the high-temperature air A3 conduct the heat exchange in an orthogonal manner.

After the low-temperature air A2 passes through the heat exchange assembly 130 and performs heat exchange with the high-temperature air A3, the low-temperature air A2 is transformed into a warm air A2'. The cooling system 100 further includes a first fan assembly 141 disposed on the upper end of the frame 150, and is situated above the heat exchange assembly 130 to drive the warm air A2' leaving the cooling system 100 and discharging to the atmosphere thereafter. The low-temperature air A2 used in the cooling system 100 is non-toxic and does not jeopardize the environment. It is safe to be discharged into the atmosphere directly. In order to drive the high-temperature air A3 passing through the air passages among the heat-dissipating fins 132a, the cooling system 100 further includes a second fan assembly 142. The second fan assembly 142 is disposed on one lateral side of the frame 150 and is adjacent to the heat exchange assembly 130 to drive the high-temperature air A3.

The cooling system 100 of the present embodiment further includes a compressor 170 and at least one air pipe 180. The compressor 170 supplies the high-pressure air A1 and is disposed either inside or outside the frame 150, depending on practical needs. In the present embodiment, the compressor 170 is exemplified by disposing inside the frame 150, and is adjacent to the heat exchange assembly 130 and the air jet elements 110. Although the cooling system 100 of the present embodiment takes the compressor 170 as the source of the high-pressure air A1, the technology of the invention is not limited thereto. Any other gas source that is able to provide pressurized air is applicable in the cooling system 100. The air pipe 180 is connected to the air inlets 111 of the air jet elements 110 to supply the high-pressure air into the air jet elements 110. In the present embodiment, the air pipe 180 is wound around the air jet elements 110 in the direction perpendicular to the air jet elements 110.

Figure 3:
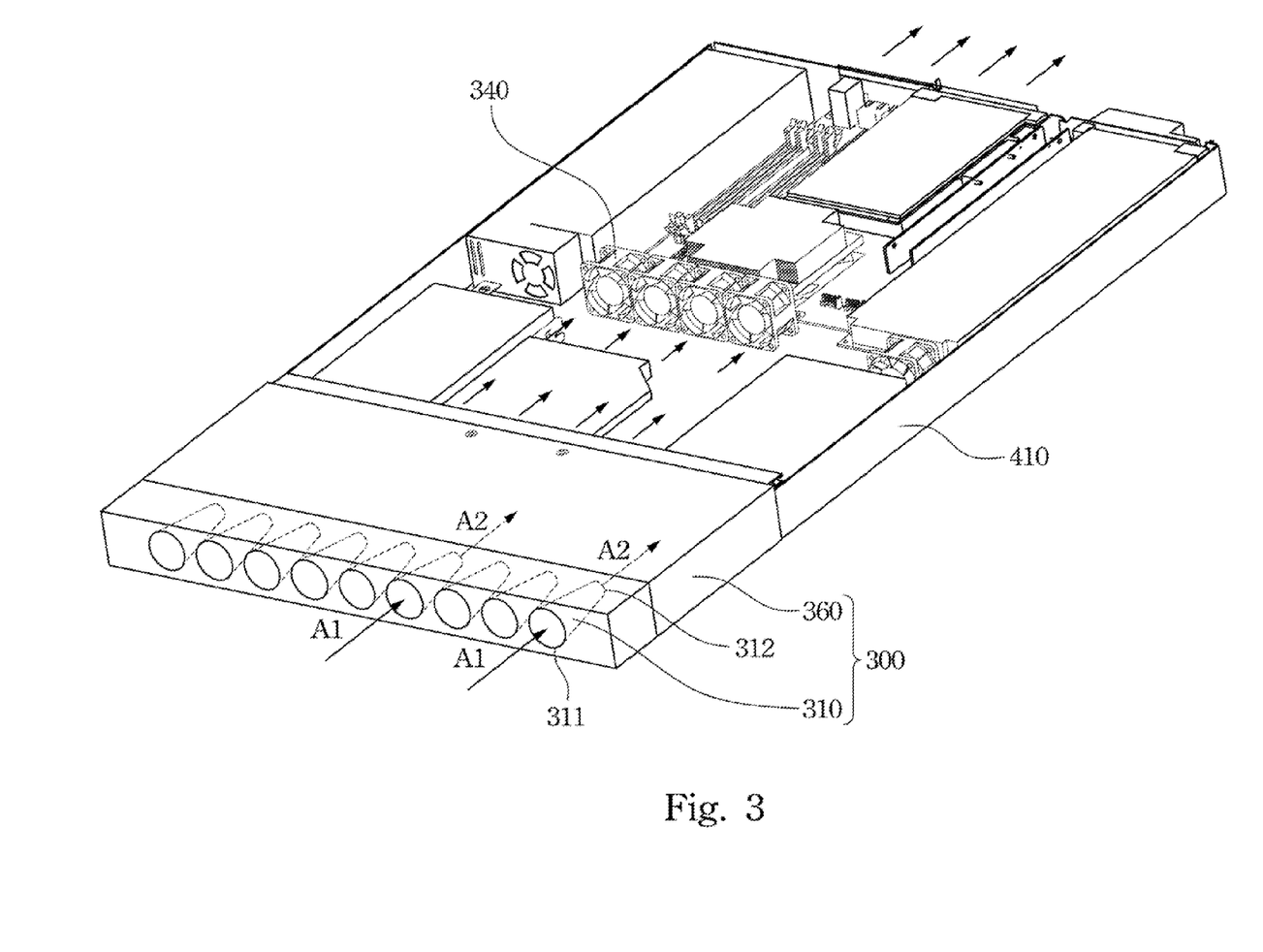
FIG. 3 is a three-dimensional diagram of a cooling system according to another embodiment of the invention.

Please refer to FIG. 3 that is a three-dimensional diagram of a cooling system according to another embodiment of the invention. The cooling system 300 is applicable to a rack server, and includes several air jet elements 310 and an air reservoir 360. The rack server is inserted with several electronic assemblies 410.

The air jet elements 310 are several air jet nozzles or several vortex tubes, or other components that lower the temperature by changing the speed of the jet air. The air jet elements 310 receive the high-pressure air A1 and convert the high-pressure air A1 into low-temperature air A2. Each air jet element 310 includes an air inlet 311 and an air outlet 312. The air inlet 311 accepts the high-pressure air A1, through which the high-pressure air A1 enters the air jet element 310. The air outlet 312 rejects the low-temperature air A2, through which the low-temperature air A2 leaves the air jet element 310.

More specifically, the air jet elements 310 are arranged in an array and reject the low-temperature air A2 toward the same direction. In the present embodiment, the air jet elements 310 are exemplified by arranging in a single row. However, the arrangement and the number of the air jet elements 310 are not limited thereto; they are adjustable in accordance with practical product needs. Exemplarily, the air jet elements 310 are air jet nozzles in the present embodiment. The temperature of the high-pressure air A1 entering the air jet element 310 through the air inlet 311 is higher than the temperature of the low-temperature air A2 leaving the air jet element 310 through the air outlet 312.

The air reservoir 360 is disposed between the enclosure 410 and the air jet elements 310 and communicates with the air outlets 312. Therefore, the low-temperature air A2 enters the air reservoir 360 and subsequently enters the electronic assemblies 410 to dissipate heat. In the present embodiment, the enclosure 410, the corresponding air jet elements 310 and the air reservoir 360 are disposed alongside in a same plane.

Figure 4A:
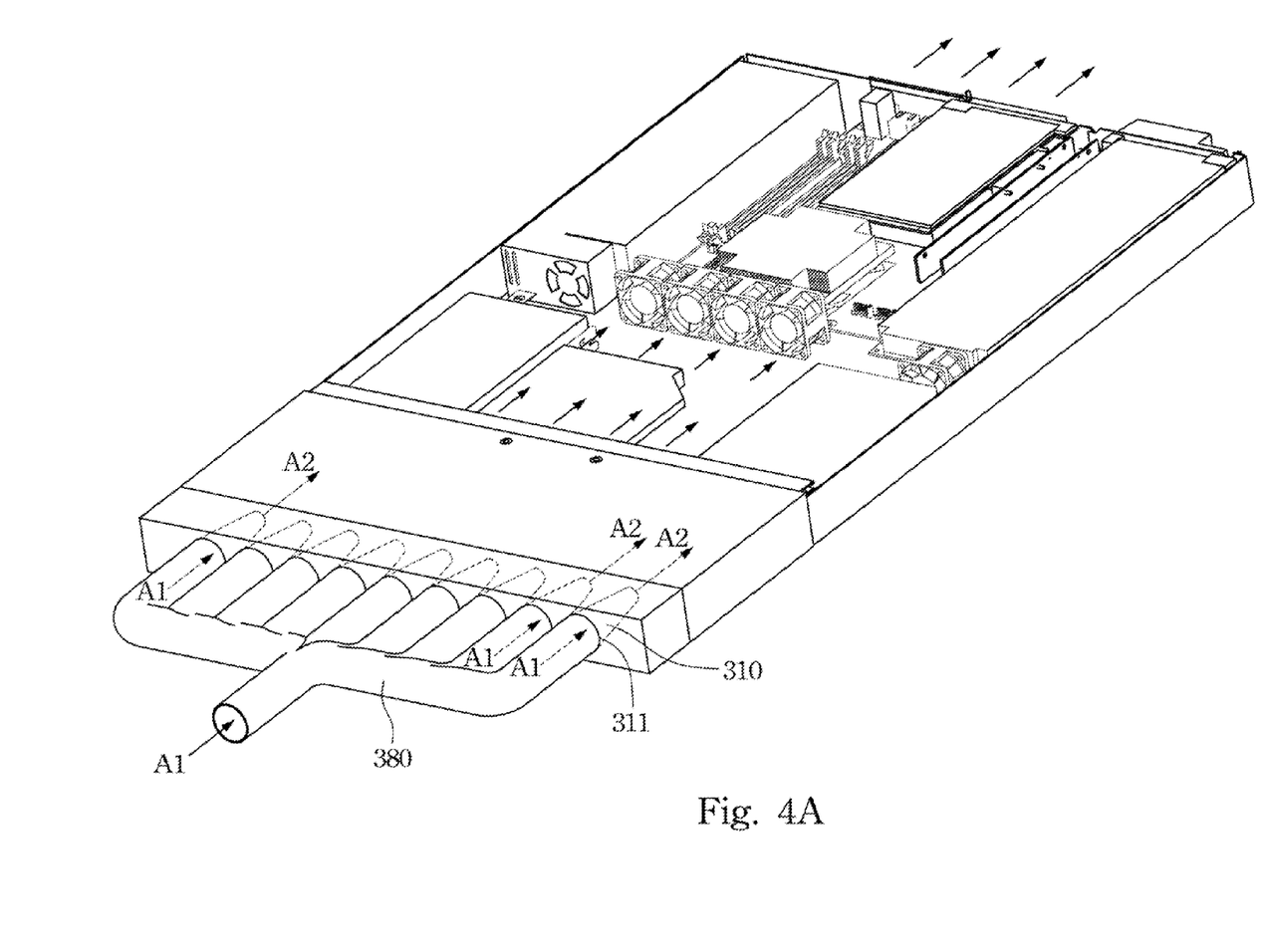
FIG. 4A is a perspective view of an air pipe connected with the air outlets of FIG. 3.

Please refer to FIG. 3 and FIG. 4A at the same time. FIG. 4A is a perspective view of an air pipe connected with the air outlets of FIG. 3. The cooling system 300 of the present embodiment further includes a fan assembly 340 and at least one air pipe 380. The fan assembly 340 is used for driving the low-temperature air A2 to move into the enclosure 410 from the front side of the enclosure 410 to take the heat away from the internal components. The fan 340 assembly is exemplified by disposing inside the enclosure 410. One side of the air pipe 380 is connected to the air inlets 311 to supply the high-pressure air A1 into the air jet elements 310. Another side of the air pipe 380 is connected to a high-pressure air source, a compressor for example, which is served as the source of the high-pressure air A1.

Figure 4B:
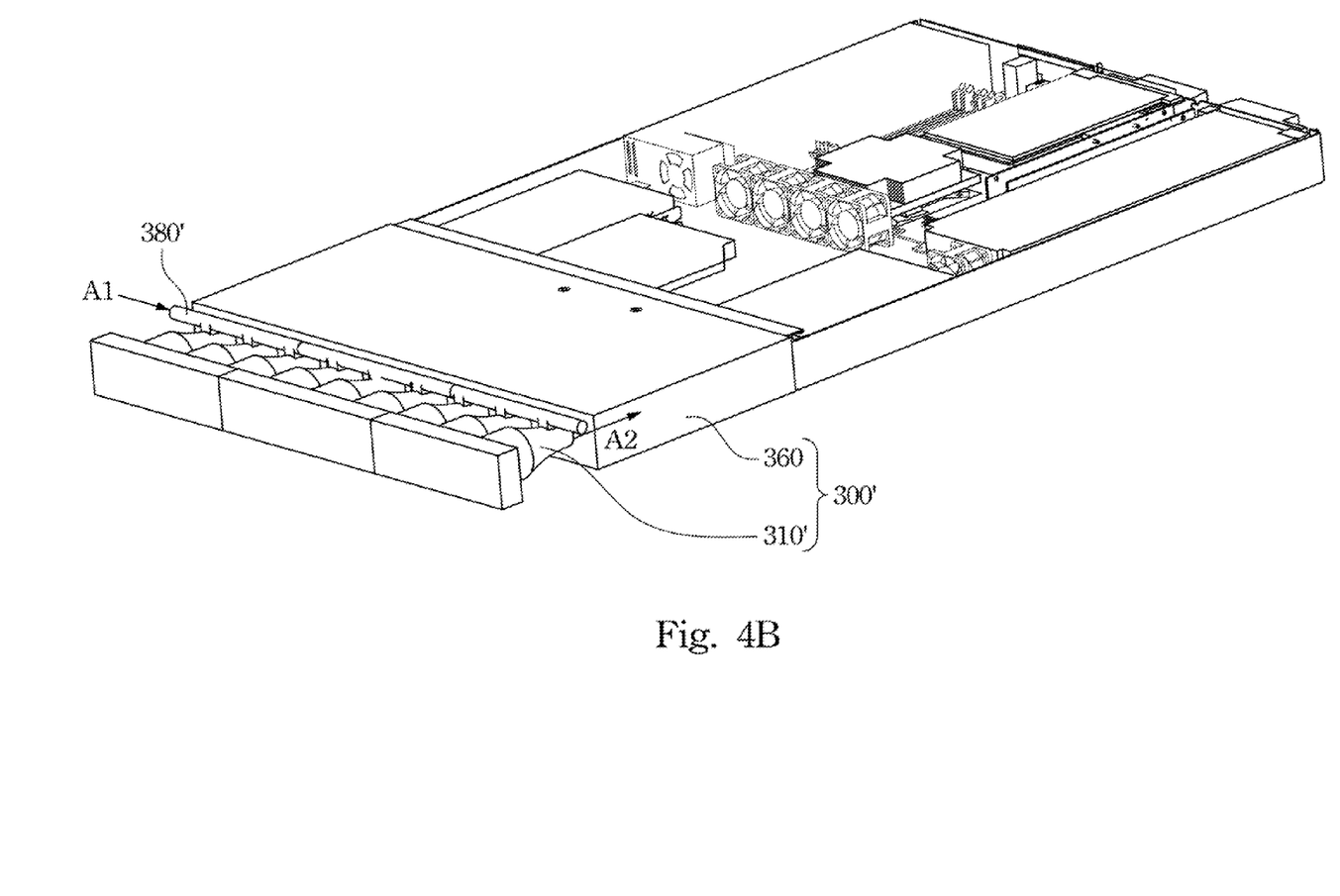
FIG. 4B is a perspective view of the cooling system having several vortex tubes.

The air jet elements 310 of the cooling system 300 are exemplified by the air jet nozzles; however, the air jet elements 310 are not limited to air jet nozzles. Please refer to FIG. 4B that is a perspective view of the cooling system having several vortex tubes. The air jet elements 310' are vortex tubes in the cooling system 300'. The vortex tubes receive the high-pressure air A1 from the air pipe 380' and convert the high-pressure air A1 into low-temperature air A2, and further reject the low-temperature air A2 into the air reservoir 360 to be mixed.

Figure 5:
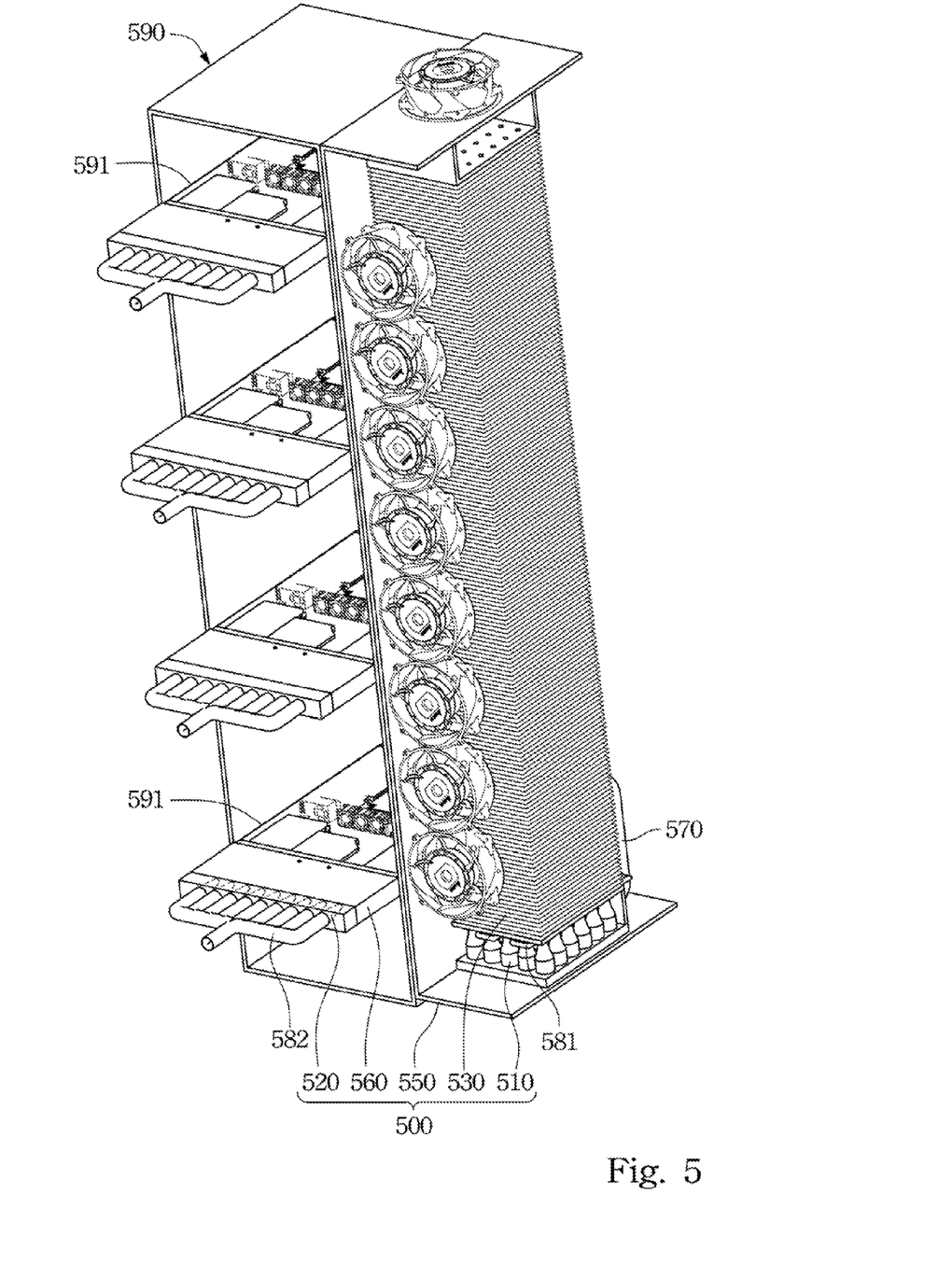
FIG. 5 is a three-dimensional diagram of a cooling system of another embodiment of the invention.

According to yet another embodiment of the invention, the two previously-described cooling systems 100 and 300 can be collaborative with each other. The cooling system 500 is applicable to a rack server 590, as shown in FIG. 5 that is a three-dimensional diagram of a cooling system of another embodiment of the invention. The rack server 590 is inserted with several electronic assemblies 591. The cooling system 500 includes several first air jet elements 510, a heat exchange assembly 530, a frame 550, several second air jet elements 520 and several air reservoirs 560.

The first air jet elements 510, the heat exchange assembly 530 and the frame 550 are similar to the air jet elements 110, the heat exchange assembly 130 and the frame 150 of the cooling system 100 in FIG. 1 and FIG. 2. The first air jet elements 510 receive the high-pressure air and convert it into a first low-temperature air. Each of the first air jet elements 510 includes a first air inlet and a first air outlet. The first air inlet accepts the high-pressure air and the first air outlet rejects the low-temperature air. The heat exchange assembly 530 includes several tubes and a fin set to perform the heat exchange between the first low-temperature air and the high-temperature air discharged by the rack server 590. The frame 550 is used for disposing the heat exchange assembly 530. The frame 550 and the heat exchange assembly 530 are disposed at one lateral side of the rack server 590. Other details are the same as the cooling system 100, and will not be repeated here.

The second air jet elements 520 and the air reservoirs 560 are similar to the air jet elements 310 and the air reservoir 360 of the cooling system 300 in FIG. 3. The second air jet elements 520 receive the high-pressure air and convert it into a second low-temperature air. Each of the second air jet elements 520 includes a second air inlet and a second air outlet. The second air inlet accepts the high-pressure air and the second air outlet rejects the low-temperature air. Each air reservoir 560 communicates with corresponding second air outlets. Therefore, the second low-temperature air enters the air reservoirs 560 and subsequently enters the electronic assemblies 591 to dissipate heat. Other details are the same as the cooling system 300, and will not be repeated here.

In the present embodiment, the first air jet elements 510 can be air jet nozzles or vortex tubes, and the second air jet elements 520 can be air jet nozzles or vortex tubes. In addition, the cooling system 500 further includes a first air pipe 581 and a second air pipe 582. The first air pipe 581 is connected to the first inlets to supply the high-pressure air into the first air jet elements 510. The second air pipe 582 is connected to the second air inlets to supply the high-pressure air into the second air jet elements 520.

The cooling system 500 further includes a compressor 570 for supplying the high-pressure air to the first air jet elements 510 and the second air jet elements 520. Alternatively, the first air jet elements 510 and the second air jet elements 520 are supplied with different high-pressure air from different high-pressure air sources.

Figure 6:
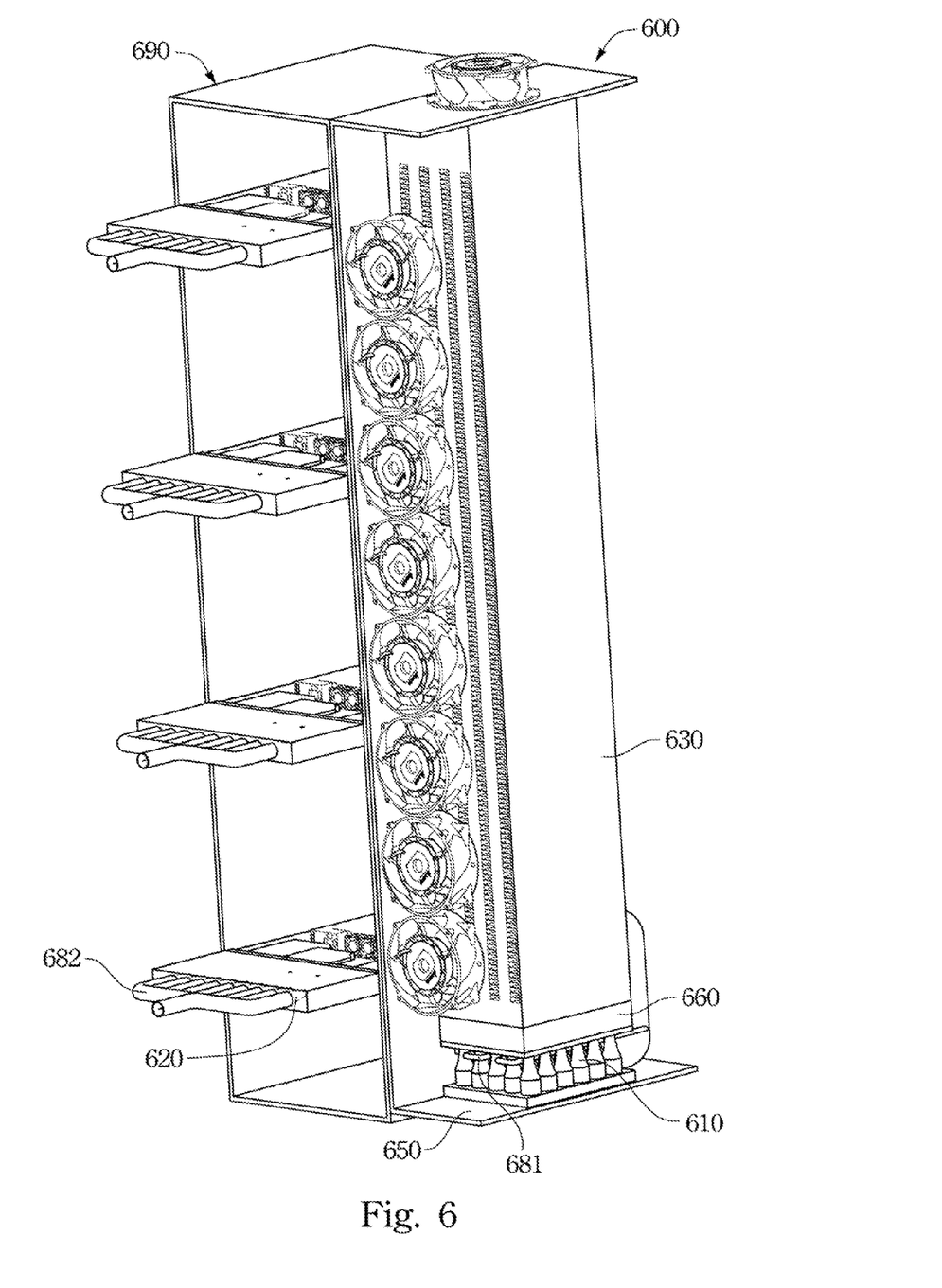
FIG. 6 is a three-dimensional diagram of a cooling system of a further embodiment of the invention.
Figure 7:
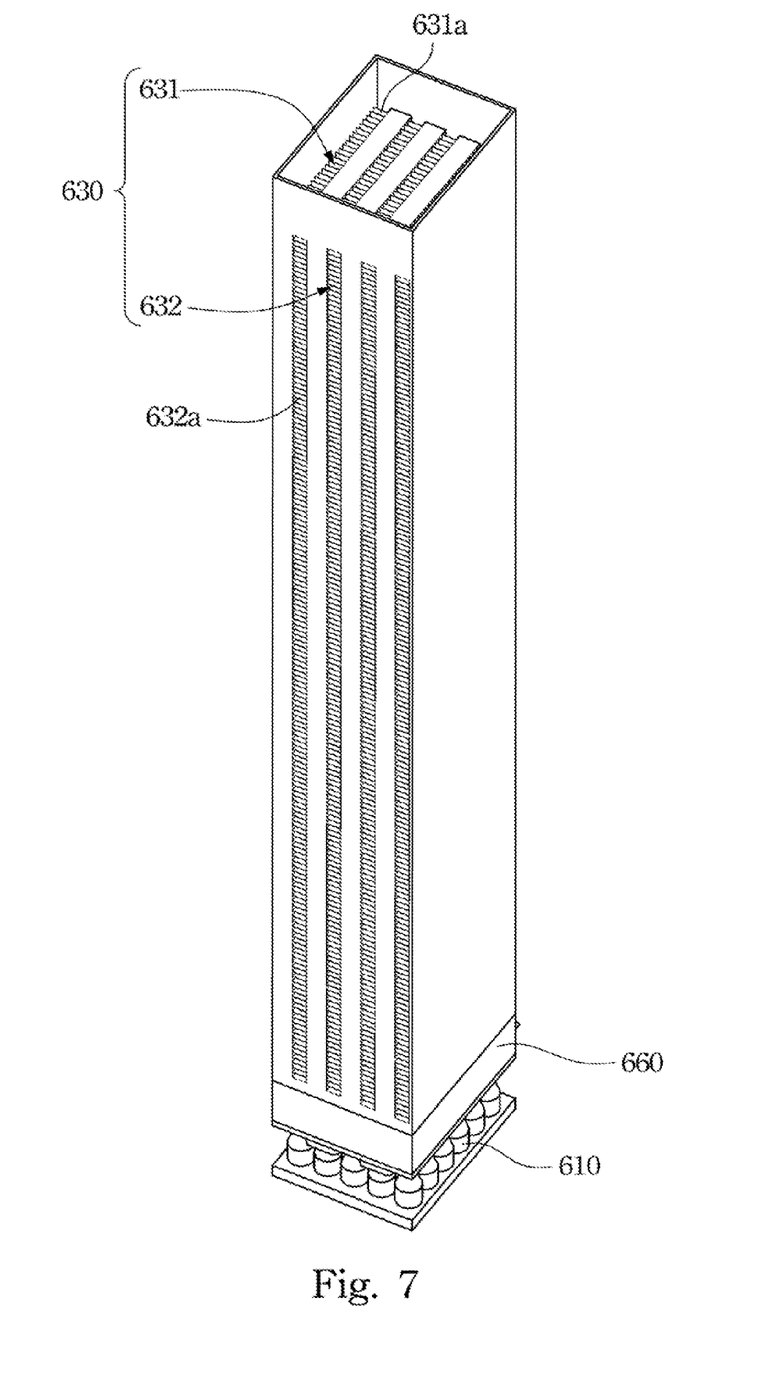
FIG. 7 is a three-dimensional diagram of the heat exchange assembly of FIG. 6.

In the pre-described cooling system 500, the heat exchange assembly 530 is exemplified by including several tubes and a fin set. Yet the heat exchange assembly 530, however, is not limited to the tubes and the fins. Please refer to FIG. 6 and FIG. 7 at the same time. FIG. 6 is a three-dimensional diagram of a cooling system of a further embodiment of the invention. FIG. 7 is a three-dimensional diagram of the heat exchange assembly of FIG. 6. The cooling system 600 includes several first air jet elements 610, several second air jet elements 620, a first air pipe 681 and a second air pipe 682. The first air jet elements 610 are disposed beneath the heat exchange assembly 630. One end of the heat exchange assembly 630 is connected to the air inlets of the first air jet elements 610. The low-temperature air provided by the first air jet elements 610 and the high-temperature air discharged by the rack server 690 undergo heat exchanging within the heat exchange assembly 630, so as to lower the temperature of the high-temperature air.

The cooling system 600 is different from the above-mentioned cooling system 500 (as shown in FIG. 5) in that their heat exchange assemblies 530 and 630 are not alike. The heat exchange assembly 630 includes a vertical fin set 631 and a horizontal fin set 632. The vertical fin set 631 includes a number of parallel disposed vertical heat-dissipating fins 631*a*. Every two neighboring vertical heat-dissipating fins 631*a* define one vertical air passage, and the low-temperature air passes through the vertical air passages. The horizontal fin set 632 includes a number of parallel disposed horizontal heat-dissipating fins 632*a*. Every two neighboring horizontal heat-dissipating fins 632*a* define one horizontal air passage, and the high-temperature air passes through the horizontal air passages. The vertical air passages and the horizontal air passages do not communicate with each other. The low-temperature air passes through the vertical fin set 631 upwardly from the bottom of the heat exchange assembly 630. The high-temperature air passes through the horizontal fin set 632 sideways from a lateral side of the heat exchange assembly 630. In this manner, the low-temperature air and the high-temperature air conduct the heat exchange in an orthogonal manner in the heat exchange assembly 630.

On the other hand, the air reservoir 660 of the cooling system 600 is further disposed between the heat exchange assembly 630 and the first air jet elements 610 to mix the low-temperature air. The mixed low-temperature air then enters the heat exchange assembly 630 from the air reservoir 660.

Figure 8:
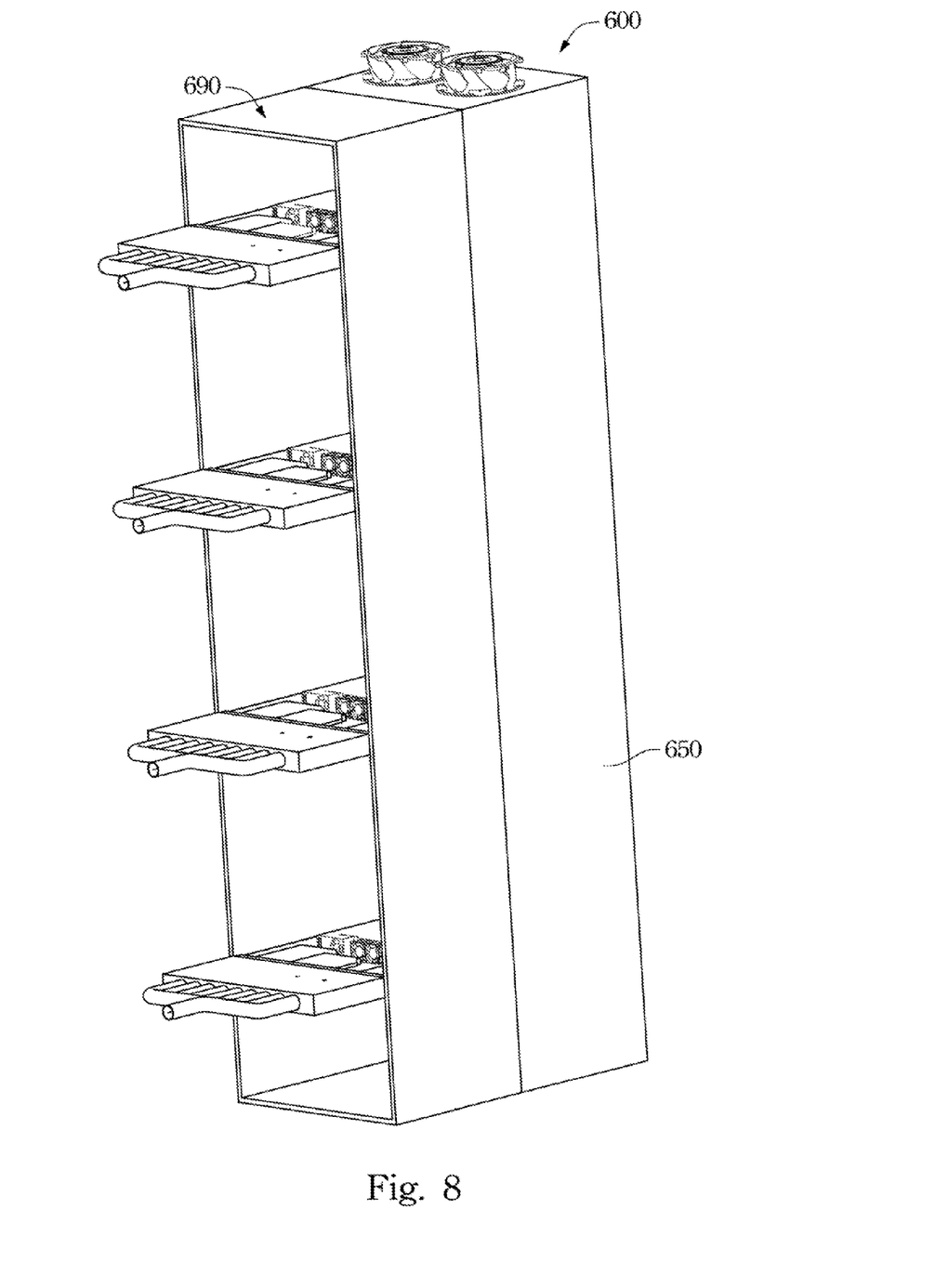
FIG. 8 is a three-dimensional diagram of the frame and the heat exchange assembly disposed behind the rack server.

In the present embodiment, the frame 650 and the heat exchange assembly 630 are disposed alongside the rack server 690; however, the disposition of the frame 650 and the heat exchange assembly 630 is not limited thereto. Please refer to FIG. 8 that is a three-dimensional diagram of the frame and the heat exchange assembly disposed behind the rack server. The frame 650 and the heat exchange assembly 630 are disposed behind the rack server 690 to directly receive the discharged high-temperature air. (It should be noticed that the heat exchange assembly 630 in the frame 650 is not shown due to the viewpoint of FIG. 8.) In this manner, the air in front of and the air in back of the rack server 690 are both chilled air. As a result, the inter-influence of the heat exchange rates of adjacent rack servers can be avoided, and the restriction on the disposition of servers is alleviated.

Figure 9:
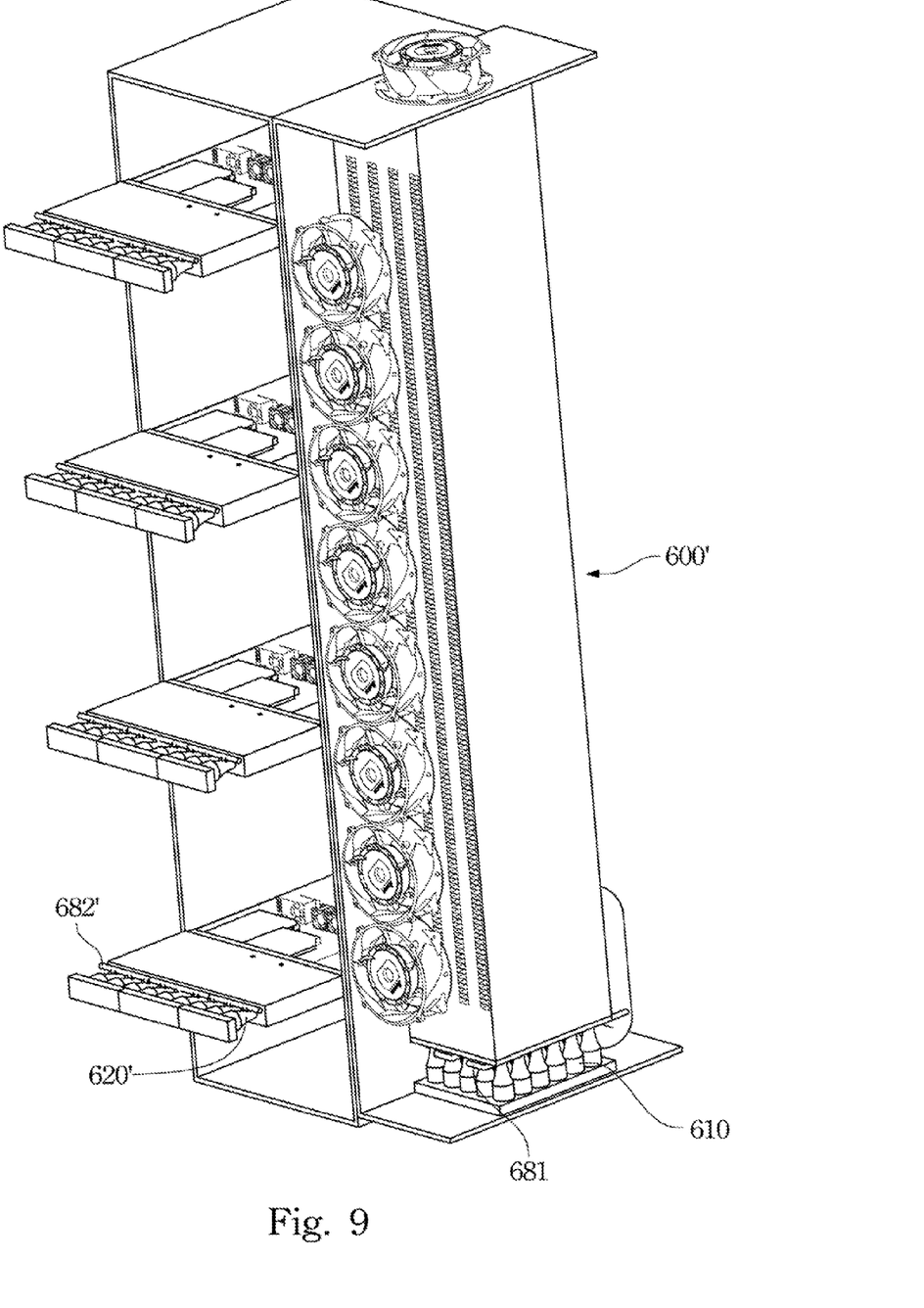
FIG. 9 is a three-dimensional diagram the cooling system having the first and the second air jet elements that are both vortex tubes.

Although the first air jet elements 610 and the second air jet elements 620 are respectively exemplified by several vortex tubes and several air jet nozzles in the cooling system 600, the cooling system 600 is not limited to use different types of air jet elements. With referring to FIG. 9 that is a three-dimensional diagram the cooling system having the first and the second air jet elements that are both vortex tubes, the first air jet elements 610 and the second air heat elements 620' of the cooling system 600' are both vortex tubes. The first air pipe 681 is connected to the first air inlets of the first air jet elements 610 to supply the high-pressure air into the first air jet elements 610. The second air pipe 682' is connected to the second air inlets of the second air jet elements 610' to supply the high-pressure air into the second air jet elements 620'.

In the above-described cooling system of the embodiment of the invention, the low-temperature air is provided by the air jet elements, and therefore the heat dissipation and the heat exchange can be performed. The cooling system uses air to perform heat exchanges, so the cooling system is environmentally friendly and cheap in view of known systems involving refrigerants. Further, the cooling system is free from the refrigerant leakage and the problem of refrigerant pollution. The heat-exchanged air can be discharged into the atmosphere directly without further cooling by an additional cooling system such as a cooling tower, the energy consumption is reduced and the post-manipulation cost is saved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A cooling system applied to a rack server that receive a plurality of electronic assemblies, comprising:
   a plurality of first air jet elements for receiving a high-pressure air and converting the high-pressure air into a first low-temperature air;
   a heat exchange assembly having one end connected to the first air jet elements to perform a heat exchange between the low-temperature air and a high-temperature air generated by the rack server to lower the temperature of the high-temperature air, wherein the low-temperature air is transformed into a warm air after passing through the heat exchange assembly;
   a frame accommodating the heat exchange assembly; and
   a first fan assembly disposed at the upper end of the frame and is situated above the heat exchange assembly to discharge the warm air to the outside of the cooling system.

2. The cooling system as claimed in claim 1, further comprising:
   a plurality of second air jet elements for receiving the high-pressure air and converting the high-pressure air into a second low-temperature air; and
   a plurality of air reservoirs individually disposed between each of the electronic assemblies and the corresponding second air jet element, wherein one side of the reservoir receives the second low-temperature air and the other side of the reservoir discharge the second low-temperature air to dissipate heat of the electronic assemblies.

3. The cooling system as claimed in claim 2, wherein each of the electronic assemblies, the corresponding air jet elements and the air reservoir are disposed alongside at a same plane.

4. The cooling system as claimed in claim 2, further comprising:
   a fan assembly for driving the low-temperature air in the air reservoir to move into the electronic, assemblies.

5. The cooling system as claimed in claim 2, wherein the first and second air jet elements are disposed in an array arrangement and individually comprise an air inlet and an air outlet, wherein the high-pressure air enters each air jet element through the air inlet and the low-temperature air leaves each air jet element through the air outlet.

6. The cooling system as claimed in claim 5, further comprising:
   at least one air pipe connected to each air inlet to supply the high-pressure air into the air jet elements.

7. The cooling system as claimed in claim 1, wherein the heat exchange assembly comprises:
   a plurality of tubes individually having one end connected to each first air jet element so that the first low-temperature air passes through the tubes; and
   a fin set allowing the tubes to penetrate therethrough to increase the area of heat exchange.

8. The cooling system as claimed in claim 7, wherein the first air jet elements are disposed beneath the heat exchange assembly and the tubes extend upwardly from the bottom of the frame.

9. The cooling system as claimed in claim 7, wherein the fin set comprises a plurality of heat-dissipating fins, at least an air passage is disposed between the two adjacent heat-dissipating fins for allowing the high-temperature air to pass therethrough, and the passing direction of the high-temperature air or the extending direction of the heat-dissipating fins is perpendicular to the extending direction of the tubes.

10. The cooling system as claimed in claim 1, wherein the heat exchange assembly comprises:
    at least a vertical fin set having a plurality of vertical heat-dissipating fins, wherein at least a vertical air passage is disposed between the two adjacent vertical heat-dissipating fins for allowing the low-temperature air to pass therethrough; and
    at least a horizontal, fin set disposed adjacent to the vertical tin set and having a plurality of horizontal heat-dissipating fins, wherein at least a horizontal air passage is disposed between the two adjacent horizontal heat-dissipating fins for allowing the high-temperature air to pass therethrough.

11. The cooling system as claimed in claim 1, further comprising:
    a second fan assembly disposed on one lateral side of the frame and is adjacent to the heat exchange assembly to drive the high-temperature air passing through the heat exchange assembly.

12. The cooling system as claimed in claim 2, further comprising a compressor for supplying the high-pressure air.

13. The cooling system as claimed in claim 1, wherein the frame and the heat exchange assembly are disposed at the lateral or rear side of the rack server.

14. The cooling system as claimed in claim 1, wherein the heat exchange assembly is made of copper, aluminum or a thermally conductive material.

15. The cooling system as claimed in claim 2. wherein the first and second air jet elements are air jet nozzles or vortex tubes.

16. A cooling system applied to a rack server that receive a plurality of electronic assemblies, comprising:
    a plurality of first air jet elements for receiving a high-pressure air and converting the high-pressure air into a low-temperature air;
    a heat exchange assembly having one end connected to the first air jet elements to perform a heat exchange between the low-temperature air and a high-temperature air generated by the rack server to lower the temperature of the high-temperature air;
    a frame accommodating the heat exchange assembly;
    a plurality of second air jet elements for receiving the high-pressure air and converting the high-pressure air into a second low-temperature air; and
    a plurality of air reservoirs individually disposed between each of the electronic assemblies and the corresponding second air jet element, wherein one side of the reservoir receives the second low-temperature air and the other side of the reservoir discharge the second low-temperature air to dissipate heat of th electronic assemblies.

17. A cooling system applied to as rack server that receive a plurality of electronic assemblies, comprising:
    a plurality of air jet elements for receiving a high-pressure air and converting the high-pressure air into a low-temperature air;

a plurality of air reservoirs individually disposed between each of the electronic assemblies and the corresponding air jet element, wherein one side of the reservoir receives the low-temperature air and the other side of the reservoir discharge the low-temperature air to dissipate heat of the electronic assemblies; and a fan assembly for driving the low-temperature air in the air reservoir to move into the electronic assemblies.

18. The cooling system as claimed in claim 17, wherein each of the air jet elements comprises an air inlet, and the cooling system further comprises:

at least one air pipe connected to each air inlet to supply the high-pressure air into the air jet elements.

19. A cooling system applied to a rack server that receive a plurality of electronic assemblies, comprising:

a plurality of air jet elements for receiving a high-pressure air and converting the high-pressure air into a low-temperature air;

a heat exchange assembly having one end connected to the air jet elements to perform a heat exchange between the low-temperature air and a high-temperature air generated by the rack server to lower the temperature of the high-temperature air, the heat exchange assembly comprising:

at least a vertical fin set having a plurality of vertical heat-dissipating fins, wherein at least a vertical air passage is disposed between the two adjacent vertical heat-dissipating fins for allowing the low-temperature air to pass therethrough; and at least a horizontal fin set disposed adjacent to the vertical fin set and having a plurality of horizontal heat-dissipating fins, wherein at least a horizontal air passage is disposed between the two adjacent horizontal heat-dissipating fins for allowing the high-temperature air to pass therethrough; and a plurality of air reservoirs individually disposed between each of the electronic assemblies and the corresponding air jet element, wherein one side of the reservoir receives the low-temperature air and the other side of the reservoir discharge the low-temperature air to dissipate heat of the electronic assemblies.

* * * * *